(12) United States Patent
Arima et al.

(10) Patent No.: US 11,621,357 B2
(45) Date of Patent: Apr. 4, 2023

(54) SCHOTTKY BARRIER DIODE

(71) Applicants: TDK Corporation, Tokyo (JP); TAMURA CORPORATION, Tokyo (JP); Novel Crystal Technology, Inc., Saitama (JP)

(72) Inventors: Jun Arima, Tokyo (JP); Minoru Fujita, Tokyo (JP); Jun Hirabayashi, Tokyo (JP); Kohei Sasaki, Saitama (JP)

(73) Assignees: TDK CORPORATION, Tokyo (JP); TAMURA CORPORATION, Tokyo (JP); NOVEL CRYSTAL TECHNOLOGY, INC., Saitama (JP)

( * ) Notice: Subject to any disclaimer, the term of this patent is extended or adjusted under 35 U.S.C. 154(b) by 0 days.

(21) Appl. No.: 17/282,629

(22) PCT Filed: Oct. 9, 2019

(86) PCT No.: PCT/JP2019/039854
§ 371 (c)(1),
(2) Date: Apr. 2, 2021

(87) PCT Pub. No.: WO2020/085095
PCT Pub. Date: Apr. 30, 2020

(65) Prior Publication Data
US 2021/0343880 A1    Nov. 4, 2021

(30) Foreign Application Priority Data
Oct. 23, 2018  (JP) .............................. JP2018-199203

(51) Int. Cl.
*H01L 29/24* (2006.01)
*H01L 29/872* (2006.01)
(Continued)

(52) U.S. Cl.
CPC .......... *H01L 29/8725* (2013.01); *H01L 29/24* (2013.01); *H01L 29/41* (2013.01); *H01L 29/47* (2013.01)

(58) Field of Classification Search
CPC combination set(s) only.
See application file for complete search history.

(56) References Cited

U.S. PATENT DOCUMENTS

2013/0119393 A1* 5/2013 Zhu .......................... H01L 25/18
438/572
2016/0042949 A1* 2/2016 Sasaki ................. H01L 27/0605
257/617

(Continued)

FOREIGN PATENT DOCUMENTS

JP    2017-045969 A    3/2017
JP    2017-199869 A    11/2017
WO    2018/020849 A1   2/2018

OTHER PUBLICATIONS

International Search Report issued in corresponding International Patent Application No. PCT/JP2019/039854, dated Dec. 10, 2019, with Engish translation.

*Primary Examiner* — Moin M Rahman
(74) *Attorney, Agent, or Firm* — McDermott Will & Emery LLP

(57) ABSTRACT

An object of the present invention is to provide a Schottky barrier diode less liable to cause dielectric breakdown due to concentration of an electric field. A Schottky barrier diode according to this disclosure includes a semiconductor substrate made of gallium oxide, a drift layer made of gallium oxide and provided on the semiconductor substrate, an anode electrode 40 brought into Schottky contact with the drift layer, a cathode electrode brought into ohmic contact with the semiconductor substrate, an insulating layer provided on the drift layer so as to surround the anode electrode (Continued)

in a plan view, and a semiconductor layer provided on a surface of a part of the drift layer that is positioned between the anode electrode and the insulating layer and on the insulating layer. The semiconductor layer has a conductivity type opposite to that of the drift layer.

16 Claims, 17 Drawing Sheets

(51) Int. Cl.
*H01L 29/41* (2006.01)
*H01L 29/47* (2006.01)

(56) References Cited

U.S. PATENT DOCUMENTS

2019/0148563 A1   5/2019  Sasaki et al.
2019/0267237 A1*  8/2019  Yuda .................. H01L 21/0495

\* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2019/039854, filed on Oct. 9, 2019, which claims the benefit of Japanese Application No. 2018-199203, filed on Oct. 23, 2018, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (7 MV/cm to 8 MV/cm), so that a Schottky barrier diode using gallium oxide is very promising as the switching element for a power device. An example of the Schottky barrier diode using gallium oxide is described in Patent Documents 1 to 3.

Patent Document 1 discloses a Schottky barrier diode having a field plate structure. A Schottky barrier diode described in Patent Document 2 has a structure in which a plurality of trenches are provided so as to overlap an anode electrode in a plan view, and the inner wall of each of the plurality of trenches is covered with an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

Further, in a Schottky barrier diode described in Patent Document 3, a p-type oxide semiconductor layer that covers a drift layer through a nitride layer is provided to form a depletion layer in the drift layer to thereby increase a withstand voltage upon application of a backward voltage.

CITATION LIST

Patent Document

[Patent Document 1] JP 2017-045969A
[Patent Document 2] JP 2017-199869A
[Patent Document 3] International Patent Publication WO 2018/020849

SUMMARY OF INVENTION

Problem to be Solved by the Invention

However, in the Schottky barrier diodes described in Patent Documents 1 and 2, an electric field concentrates on the end portion of the anode electrode, so that when a high voltage is applied, dielectric breakdown occurs in this portion. Further, in the Schottky barrier diodes described in Patent Document 2, an electric field concentrates also on the edge part of the trench positioned at the end portion, which may cause dielectric breakdown at this portion.

In the Schottky barrier diode described in Patent Document 3, an electric field is relaxed by covering the surface of the drift layer with the p-type oxide semiconductor layer; however, the electric field concentrates on the drift layer at a part thereof that overlaps the end portion of the p-type oxide semiconductor layer, which may cause dielectric breakdown at this portion.

It is therefore an object of the present invention to provide a Schottky barrier diode using gallium oxide, which is less liable to cause dielectric breakdown due to concentration of an electric field.

Means for Solving the Problem

A Schottky barrier diode according to the present invention includes: a semiconductor substrate made of gallium oxide; a drift layer made of gallium oxide and provided on the semiconductor substrate; an anode electrode brought into Schottky contact with the drift layer; a cathode electrode brought into ohmic contact with the semiconductor substrate; an insulating layer provided on the drift layer so as to surround the anode electrode in a plan view; and a semiconductor layer provided on the surface of a part of the drift layer that is positioned between the anode electrode and the insulating layer and on the insulating layer, the semiconductor layer having a conductivity type opposite to that of the drift layer.

According to the present invention, the surface of the drift layer is covered with the semiconductor layer having a conductivity type opposite to that of the drift layer, so that when a backward voltage is applied, a depletion layer extends in a part of the drift layer that is covered with the opposite conductivity type semiconductor layer. This relaxes concentration of an electric field on the corner portion of the anode electrode. Further, the Schottky barrier diode has a field plate structure in which apart of the semiconductor layer rides over the insulating layer, so that the electric field concentrating on the end portion of the semiconductor layer is also relaxed. As a result, there can be provided a Schottky barrier diode which is less likely to cause dielectric breakdown due to a backward voltage.

In the present invention, the semiconductor layer may be made of an oxide semiconductor material. This can prevent a change in the characteristics of the semiconductor layer due to oxidation.

In the present invention, the anode electrode and the semiconductor layer may overlap each other. This can relax electric field concentration at the corner portion of the anode electrode more effectively.

In the present invention, the drift layer may further have a plurality of center trenches formed at a position overlapping the anode electrode in a plan view. In this case, the inner wall of each of the plurality of center trenches may be covered with an insulating film. With this configuration, a mesa region positioned between the adjacent center trenches becomes a depletion layer upon application of a backward voltage, so that a channel region of the drift layer is pinched off. Thus, a leak current upon application of the backward voltage can be significantly reduced.

Advantageous Effects of the Invention

As described above, according to the present invention, there can be provided a Schottky barrier diode using gallium

MODE FOR CARRYING OUT THE INVENTION

Preferred embodiments of the present invention will be explained below in detail with reference to the accompanying drawings.

First Embodiment

Figure 1:
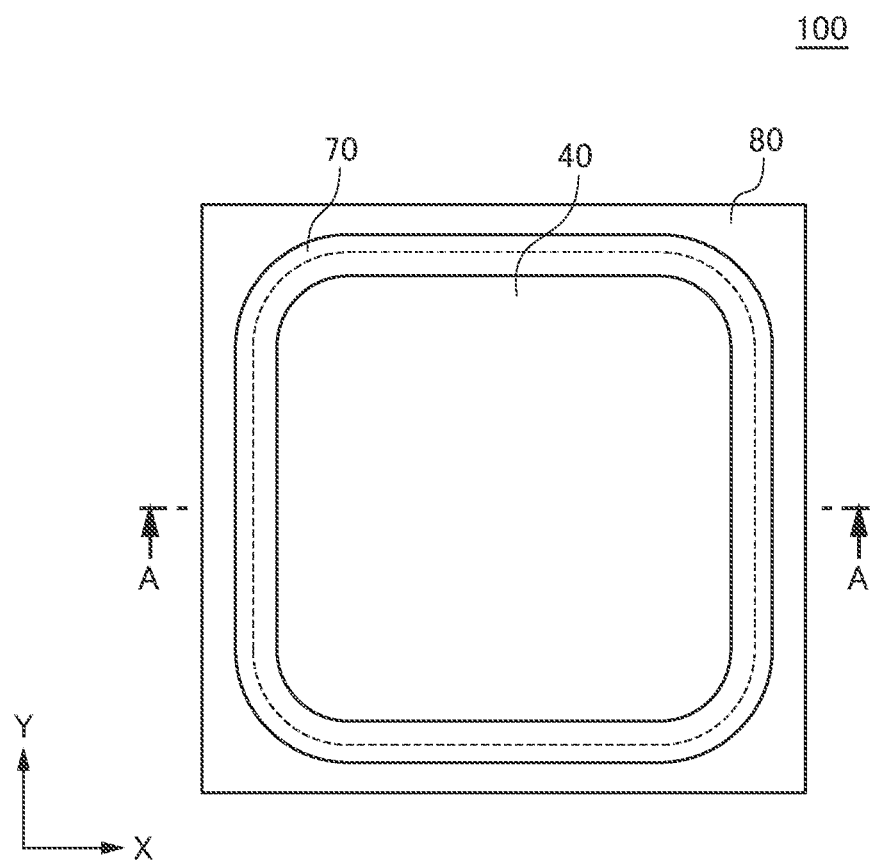
FIG. 1 is a schematic top view illustrating the configuration of a Schottky barrier diode 100 according to a first embodiment of the present invention.
Figure 2:
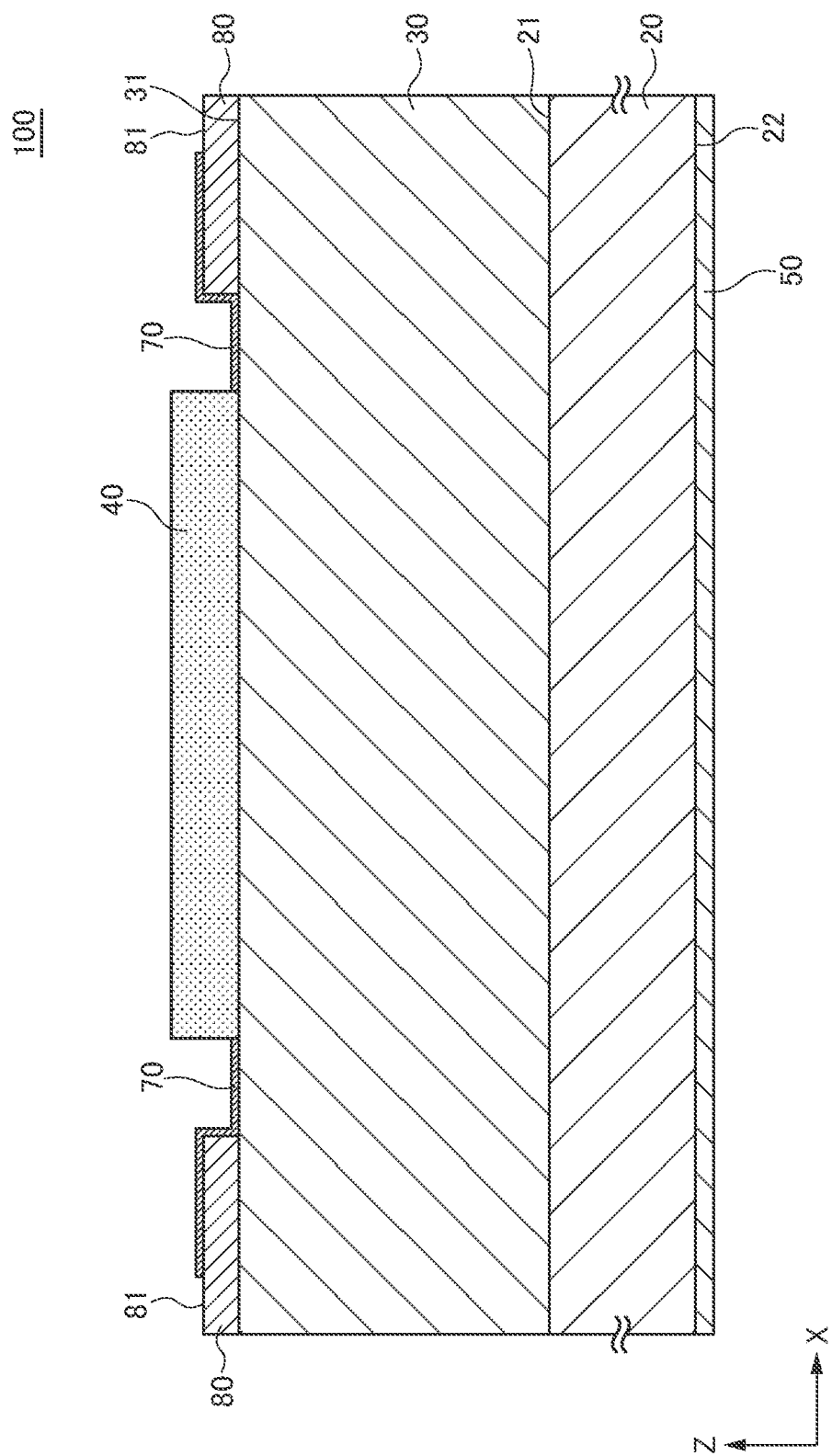
FIG. 2 is a schematic cross-sectional view taken along line A-A in FIG. 1.

FIG. 1 is a schematic top view illustrating the configuration of a Schottky barrier diode 100 according to a first embodiment of the present invention. FIG. 2 is a schematic cross-sectional view taken along line A-A in FIG. 1.

As illustrated in FIGS. 1 and 2, the Schottky barrier diode 100 according to the present embodiment includes a semiconductor substrate 20 and a drift layer 30, both of which are made of gallium oxide ($\beta$-$Ga_2O_3$). The semiconductor substrate 20 and the drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness (height in the Z-direction) thereof is about 250 µm. Although there is no particular restriction on the planar size of the semiconductor substrate 20, the planar size is generally selected in accordance with the amount of current flowing in the element and, when the maximum amount of forward current is about 20 A, the widths in the X- and Y-directions may be set to about 2.4 mm.

The semiconductor substrate 20 has an upper surface 21 positioned on the upper surface side and a back surface 22 positioned on the lower surface side, in a mounted state. The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and may be set to, e.g., about 7 µm in order to ensure a withstand voltage of about 600 V.

An anode electrode 40 is formed on an upper surface 31 of the drift layer 30 so as to be brought into Schottky contact with the drift layer 30. The anode electrode 40 is formed of metal such as platinum (Pt), palladium (Pd), gold (Au), nickel (Ni), or the like. The anode electrode 40 may have a multilayer structure of different metal films such as Pt/Au, Pt/Al, Pd/Au, Pd/Al, Pt/Ti/Au, or Pd/Ti/Au. On the other hand, a cathode electrode 50 is formed on the back surface 22 of the semiconductor substrate 20 so as to be brought into ohmic contact with the semiconductor substrate 20. The cathode electrode 50 is formed of metal such as titanium (Ti). The cathode electrode 50 may have a multilayer structure of different metal films such as Ti/Au or Ti/Al.

Further, an insulating layer 80 is formed on the upper surface 31 of the drift layer 30 so as not to overlap the anode electrode 40 and to surround the same in a plan view (as viewed in the Z-direction). The material of the insulating layer 80 may be $SiO_2$, $HfO_2$, $Al_2O_3$, $ZrO_2$, or the like and is preferably a material as high a dielectric withstand voltage and a relative dielectric constant as possible. However, in many cases, the dielectric withstand voltage and relative dielectric constant of an insulating material are in a trade-off relationship. The thickness of the insulating layer 80 is preferably designed considering that a smaller thickness increases a dispersion effect of the electric field applied to the drift layer 30 and that an excessively small thickness increases the strength of the electric field applied to the insulating layer 80 itself. Specifically, the thickness of the insulating layer 80 is set to about 600 nm to 800 nm.

A part of the surface of the drift layer 30 positioned between the anode electrode 40 and the insulating layer 80 is covered with a semiconductor layer 70 having a conductivity type opposite to that of the drift layer 30. The drift layer 30 and the semiconductor layer 70 may directly contact each other, or may contact each other through an insulating film or the like. A part of the semiconductor layer 70 is formed on the upper surface 81 of the insulating layer 80 beyond the inner peripheral edge of the insulating layer 80 so that so-called field plate structure can be obtained. Since the conductivity type of the drift layer 30 is an n-type, the semiconductor layer 70 needs to be formed of a p-type semiconductor material. Examples of the p-type semiconductor material include Si, GaAs, SiC, Ge, ZnSe, CdS, InP, SiGe, and a p-type oxide semiconductor such as NiO, $Cu_2O$, or $Ag_2O$. The p-type semiconductor material has an advantage of being free from oxidation. In particular, NiO is a special material that exhibits only a p-type conductivity and is most preferable in terms of quality stabilization. Further, NiO has a band gap as large as 3.7 eV and is thus desirable as a material taking advantage of high withstand voltage of gallium oxide. Further, to control acceptor concentration, Li or La may be added as a dopant in a ratio of about 0.2 mol % to 1.0 mol % to NiO (99.9%). The acceptor concentration is preferably equal to or higher than $5 \times 10^{17}$ cm$^{-3}$ and more preferably equal to or higher than $5 \times 10^{18}$ cm$^{-3}$ in terms of production stability. This is because a low acceptor concentration may cause depletion of the semiconductor layer 70, which may fail to provide a desired function. Thus, a higher acceptor concentration is more preferable. However, when the acceptor concentration exceeds $1 \times 10^{22}$ cm$^{-3}$, film characteristics may deteriorate, so that the acceptor concentration is preferably equal to or lower than about $5 \times 10^{21}$ cm$^{-3}$. The semiconductor layer 70 may be in a floating state, or may contact the anode electrode 40. The surface of the semiconductor layer 70 is preferably covered with a passivation film of $SiO_2$ or the like.

When in a fully amorphous state, the p-type oxide constituting the semiconductor layer 70 is unintentionally crystallized in a heating process during device production, which may make the characteristics thereof unstable. Considering this, at the time when the p-type oxide is formed on the drift layer 30, about 50% by volume thereof may be crystallized, for example. This can reduce the influence of crystallization in a heat process during device production.

Figure 3:
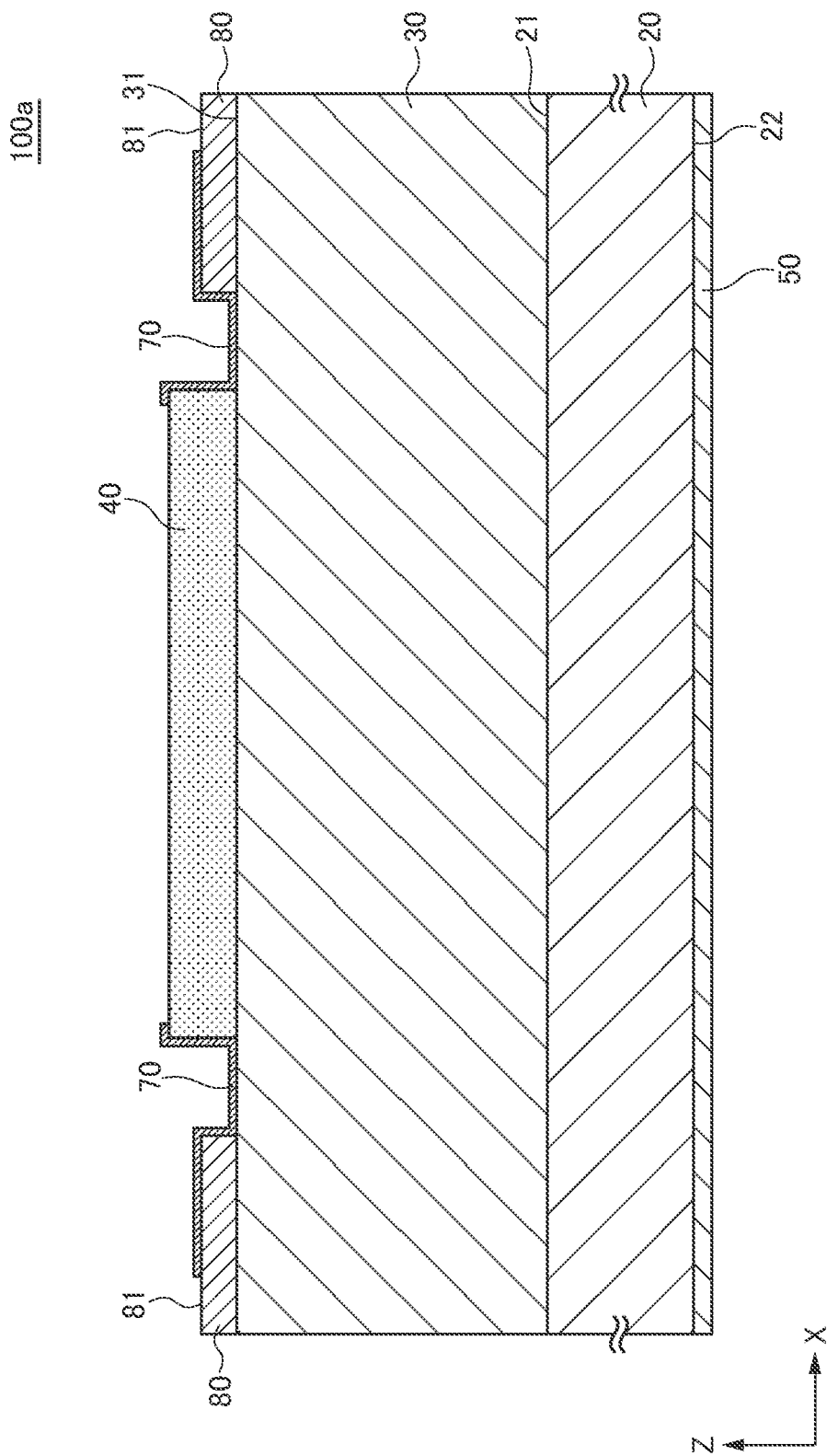
FIG. 3 is a schematic cross-sectional view illustrating the configuration of a Schottky barrier diode 100a according to a first modification of the first embodiment.
Figure 4:
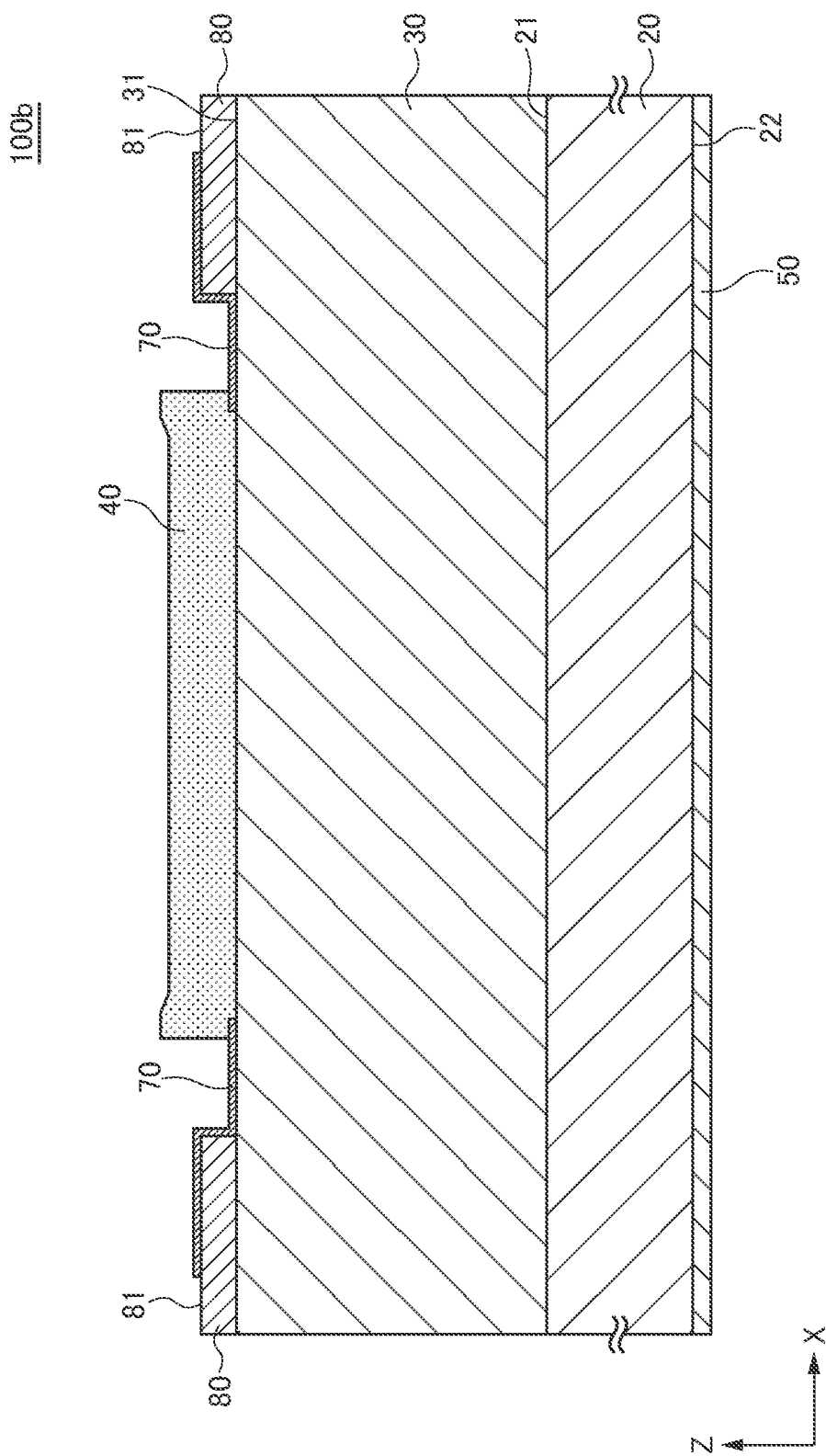
FIG. 4 is a schematic cross-sectional view illustrating the configuration of a Schottky barrier diode 100b according to a second modification of the first embodiment.

Since the semiconductor layer 70 has a conductivity type opposite to that of the drift layer 30, a depletion layer extends around a part of the drift layer 30 that is covered with the semiconductor layer 70 due to a potential difference. Thus, when a backward voltage is applied between the anode electrode 40 and the cathode electrode 50, an electric field concentrating on the end portion of the anode electrode 40 is relaxed. The electric field concentrating on the end portion of the anode electrode 40 is relaxed more effectively as a gap between the anode electrode 40 and the semiconductor layer 70 is smaller, so that the anode electrode 40 and the semiconductor layer 70 preferably contact each other. When it is difficult to make the outer peripheral edge of the anode electrode 40 and the inner peripheral edge of the semiconductor layer 70 coincide with each other, a part of the semiconductor layer 70 may be formed on the anode electrode 40 so as to cover the outer peripheral edge of the anode electrode 40 as in a Schottky barrier diode 100a according to a first modification (FIG. 3). Alternatively, a part of the anode electrode 40 may be formed on the semiconductor layer 70 so as to cover the inner peripheral edge of the semiconductor layer 70 as in a Schottky barrier diode 100b according to a second modification (FIG. 4). With the above configurations, an overlap occurs between the anode electrode 40 and the semiconductor layer 70, allowing the anode electrode 40 and semiconductor layer 70 to reliably contact each other.

Figure 5:
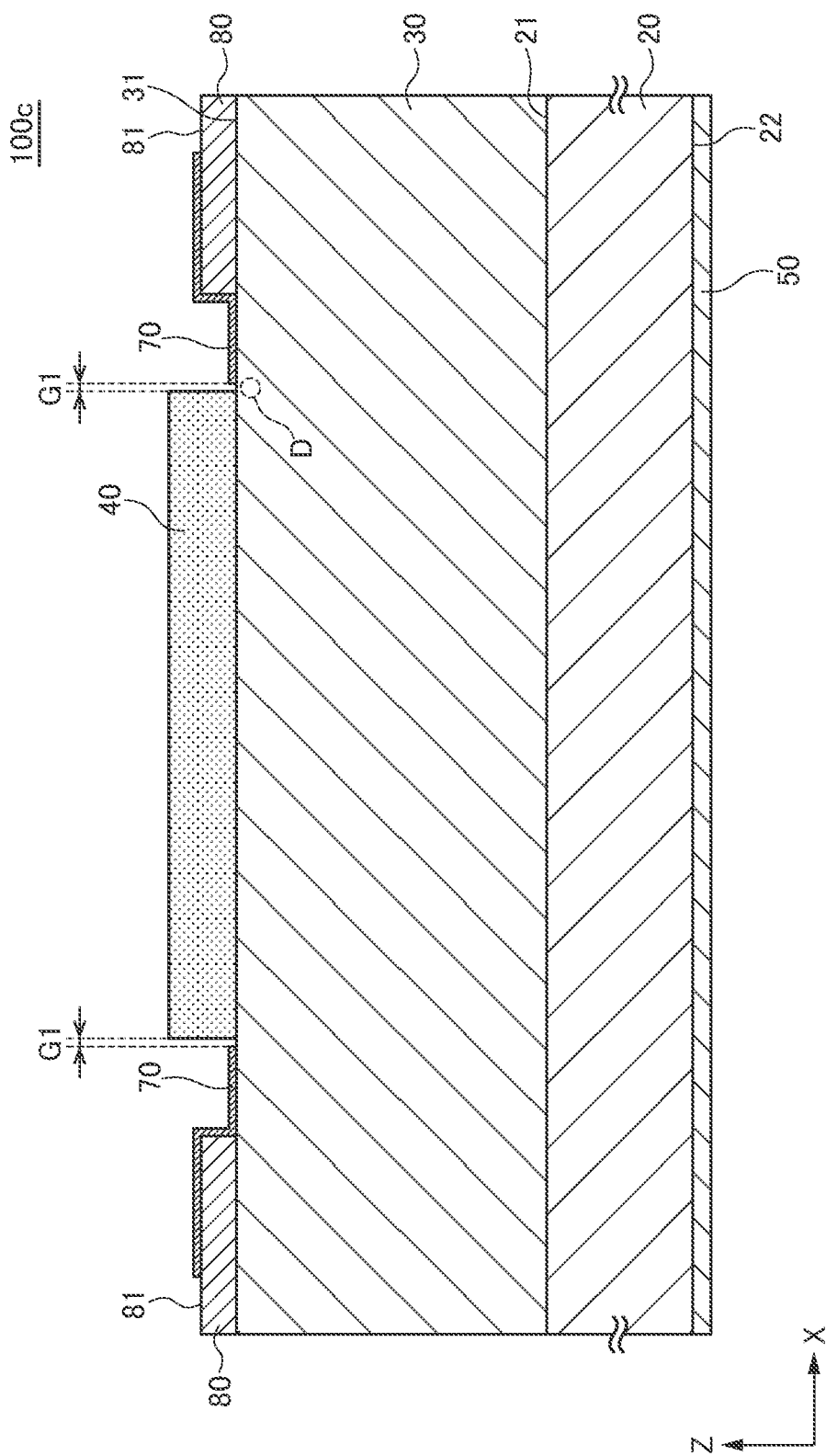
FIG. 5 is a schematic cross-sectional view illustrating the configuration of a Schottky barrier diode 100c according to a third modification of the first embodiment.

However, in the present invention, it is not essential to make the anode electrode 40 and the semiconductor layer 70 contact each other, but a gap G1 may exist between the outer peripheral edge of the anode electrode 40 and the inner peripheral edge of the semiconductor layer 70 as in a Schottky barrier diode 100c according to a third modification (FIG. 5). The electric field concentrating on the end portion of the anode electrode 40 becomes stronger as the gap G1 is larger, so that the gap G1 should preferably be as small as possible.

As described above, the electric field concentrating on the end portion of the anode electrode 40 is relaxed by providing the semiconductor layer 70. In this case, the electric field concentrates on the outer peripheral edge of the semiconductor layer 70, which, however, is relaxed by the insulating layer 80 since the outer peripheral edge of the semiconductor layer 70 is positioned on the insulating layer 80. Thus, in the present embodiment, the electric field concentrating on the end portion of the anode electrode 40 is relaxed by the semiconductor layer 70, and electric field concentrating on the outer peripheral edge of the semiconductor layer 70 is relaxed by the insulating layer 80, thereby making it possible to prevent dielectric breakdown upon application of a backward voltage.

Figure 6:
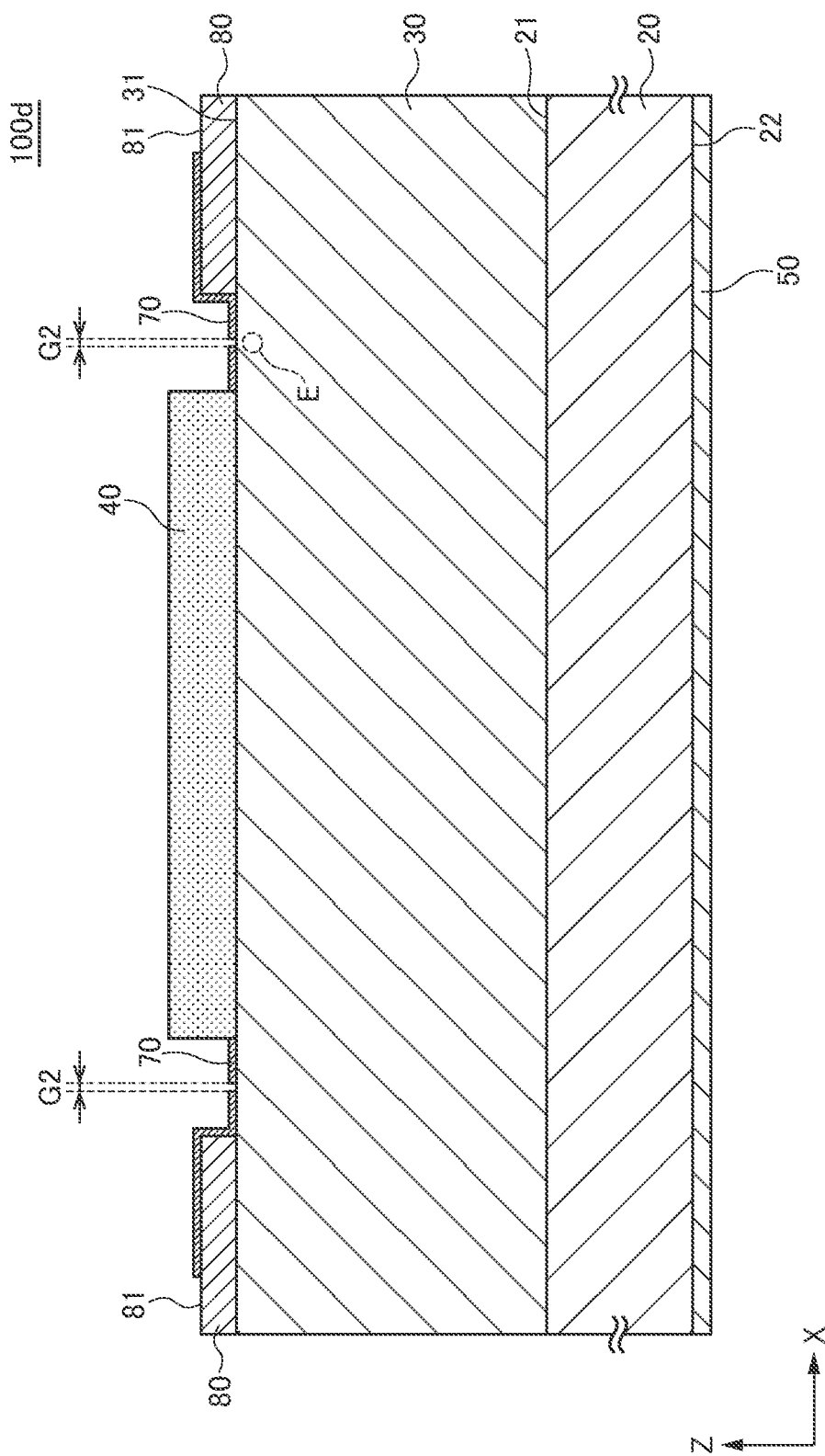
FIG. 6 is a schematic cross-sectional view illustrating the configuration of a Schottky barrier diode 100d according to a fourth modification of the first embodiment.

The semiconductor layer 70 need not be a completely continuous film, but a slit or a cut may be formed in the semiconductor layer 70 so as to partially expose the drift layer 30 therethrough as in a Schottky barrier diode 100d according to a fourth modification (FIG. 6). Further, as in a Schottky barrier diode 100e according to a fifth modification (FIG. 7), the insulating layer 80 may be exposed through a slit or a cut formed in the semiconductor layer 70. However, when the slit or cut exists in the semiconductor layer 70, an electric field concentrates on this portion, so that gaps G2 and G3 generated by the slit or cut should preferably be made as small as possible.

As described above, in the Schottky barrier diode 100 according to the present embodiment, the surface of the drift layer 30 positioned between the anode electrode 40 and the insulating layer 80 is covered with the semiconductor layer 70 having a conductivity type opposite to that of the drift layer 30, so that the electric field concentrating on the end portion of the anode electrode 40 is relaxed by a depletion layer that extends due to the existence of the semiconductor layer 70. Further, the Schottky barrier diode 100 has a field plate structure in which the semiconductor layer 70 rides over the insulating layer 80, so that the electric field concentrating on the outer peripheral edge of the semiconductor layer 70 is also relaxed. As a result, it is possible to prevent dielectric breakdown due to electric field concentration.

Second Embodiment

Figure 8:
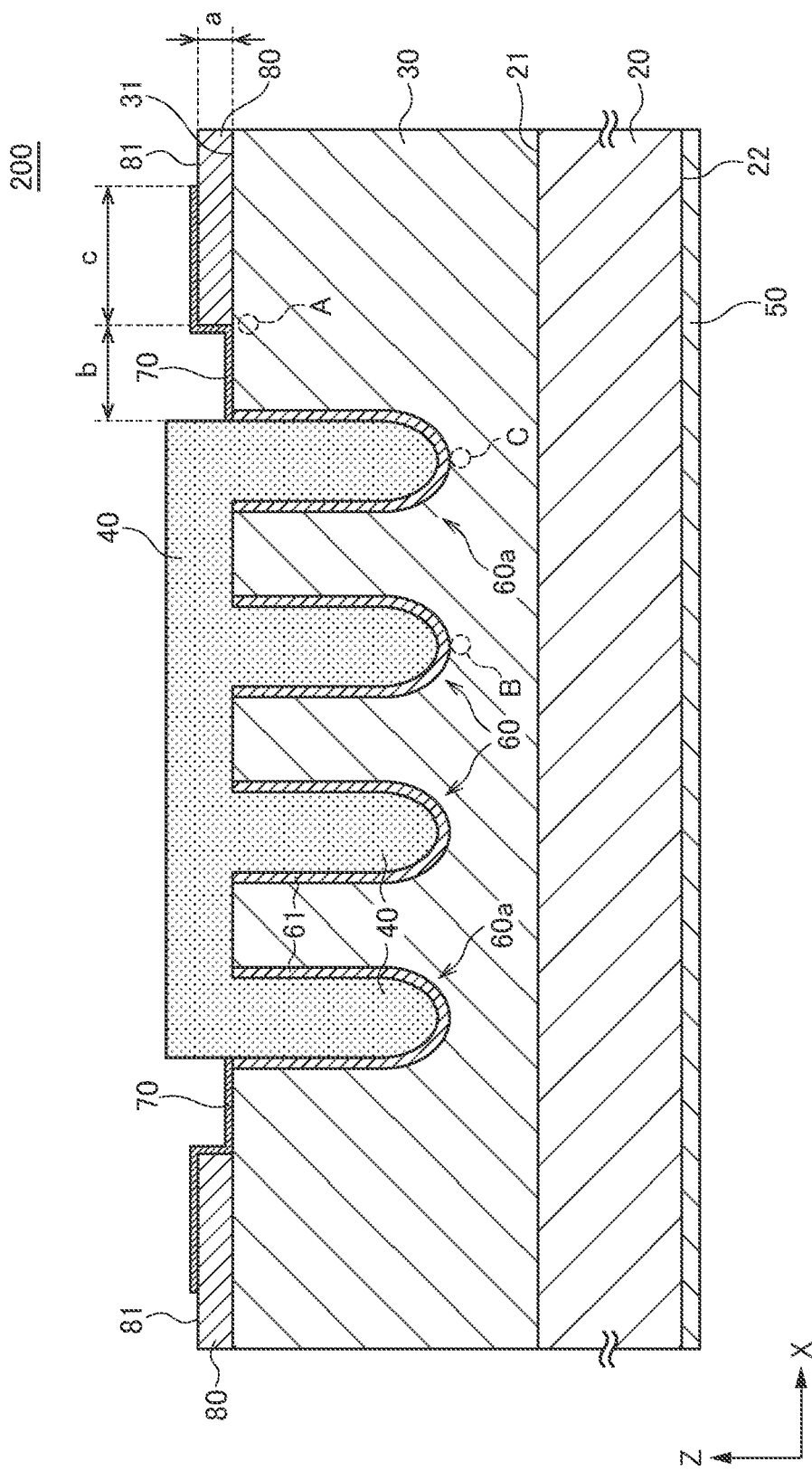
FIG. 8 is a schematic cross-sectional view illustrating the configuration of a Schottky barrier diode 200 according to a second embodiment of the present invention.

FIG. 8 is a schematic cross-sectional view illustrating the configuration of a Schottky barrier diode 200 according to a second embodiment of the present invention.

As illustrated in FIG. 8, in the Schottky barrier diode 200 according to the second embodiment, a plurality of center trenches 60 are formed in the drift layer 30. The center trenches 60 are all formed at a position overlapping the anode electrode 40 in a plan view. The inner wall of each of the center trenches 60 is covered with an insulating film 61 made of HfO$_2$ or the like. The conductive material filled in the center trench 60 may be the same as that of the anode electrode 40 or may be a highly doped polycrystalline Si or a metal material such as Ni or Au. In the present embodiment, the plurality of center trenches 60 are formed in the drift layer 30, so that the anode electrode 40 may be made of a material having a low work function, such as molybdenum (Mo) or copper (Cu). Further, in the present embodiment, the dopant concentration of the drift layer 30 can be increased up to about $5\times10^{16}$ cm$^{-3}$. Other configurations are basically the same as those of the Schottky barrier diode 100 according to the first embodiment, so the same reference numerals are given to the same elements, and overlapping description will be omitted.

Apart of the drift layer 30 positioned between the adjacent center trenches 60 constitutes a mesa region. The mesa region becomes a depletion layer when a backward voltage is applied between the anode electrode 40 and the cathode electrode 50, so that a channel region of the drift layer 30 is pinched off. Thus, a leak current upon application of the backward voltage is significantly reduced.

In the Schottky barrier diode having such a structure, an electric field concentrates on the bottom portion of a center trench 60a positioned at the end portion, making it more susceptible to dielectric breakdown at this portion. However, in the Schottky barrier diode 200 according to the present embodiment, the surface of the drift layer 30 is covered with the semiconductor layer 70 and the semiconductor layer 70 has a field plate structure so as to cover the insulating layer 80, and hence the electric field concentrating on the center trench 60a at the end portion is relaxed.

As described above, the Schottky barrier diode 200 according to the present embodiment has an effect that can reduce a leak current upon application of a backward voltage, in addition to the effect obtained by the Schottky barrier diode 100 according to the first embodiment.

Further, although the inner wall of the center trench 60 is covered with the insulating film 61, and the inside thereof is filled with the same material as the anode electrode 40 in the present embodiment, the inside of the center trench 60 may be filled with a semiconductor material of an opposite conductivity type (p-type, in the present embodiment) without the use of the insulating film 61.

While the preferred embodiments of the present invention have been described, the present invention is not limited to the above embodiments, and various modifications may be made within the scope of the present invention, and all such modifications are included in the present invention.

Example 1

A simulation model of Example 1 having the same structure as the Schottky barrier diode 200 illustrated in FIG. 8 was assumed, and electric field strength was simulated with a backward voltage applied between the anode electrode 40 and the cathode electrode 50. The material of the anode electrode 40 was Mo, and the cathode electrode 50 was a laminated film of Ti and Au. The dopant concentration of the semiconductor substrate 20 was set to $1\times10^{18}$ cm$^{-3}$ and the dopant concentration of the drift layer 30 was to $5\times10^{16}$ cm$^{-3}$. The thickness of the drift layer 30 was set to 7 μm. The depth and width of the center trench 60 were set to 3 μm and 1 μm, respectively, the mesa width of the mesa region was set to 2 μm, and the insulating film 61 formed on the inner wall of the center trench 60 was an HfO$_2$ film having a thickness of 50 nm. The semiconductor layer 70 was NiO having an acceptor concentration of $1\times10^{19}$ cm$^{-9}$ and the thickness thereof was set to 100 nm. The material of the insulating layer 80 was SiO$_2$. The thickness a of the insulating layer 80, the width b of a part of the semiconductor layer 70 that contacts the drift layer 30, and the width c of a part of the semiconductor layer 70 that is positioned on the insulating layer 80 were set to 600 nm, 30 μm, and 30 μm, respectively.

Figure 9:
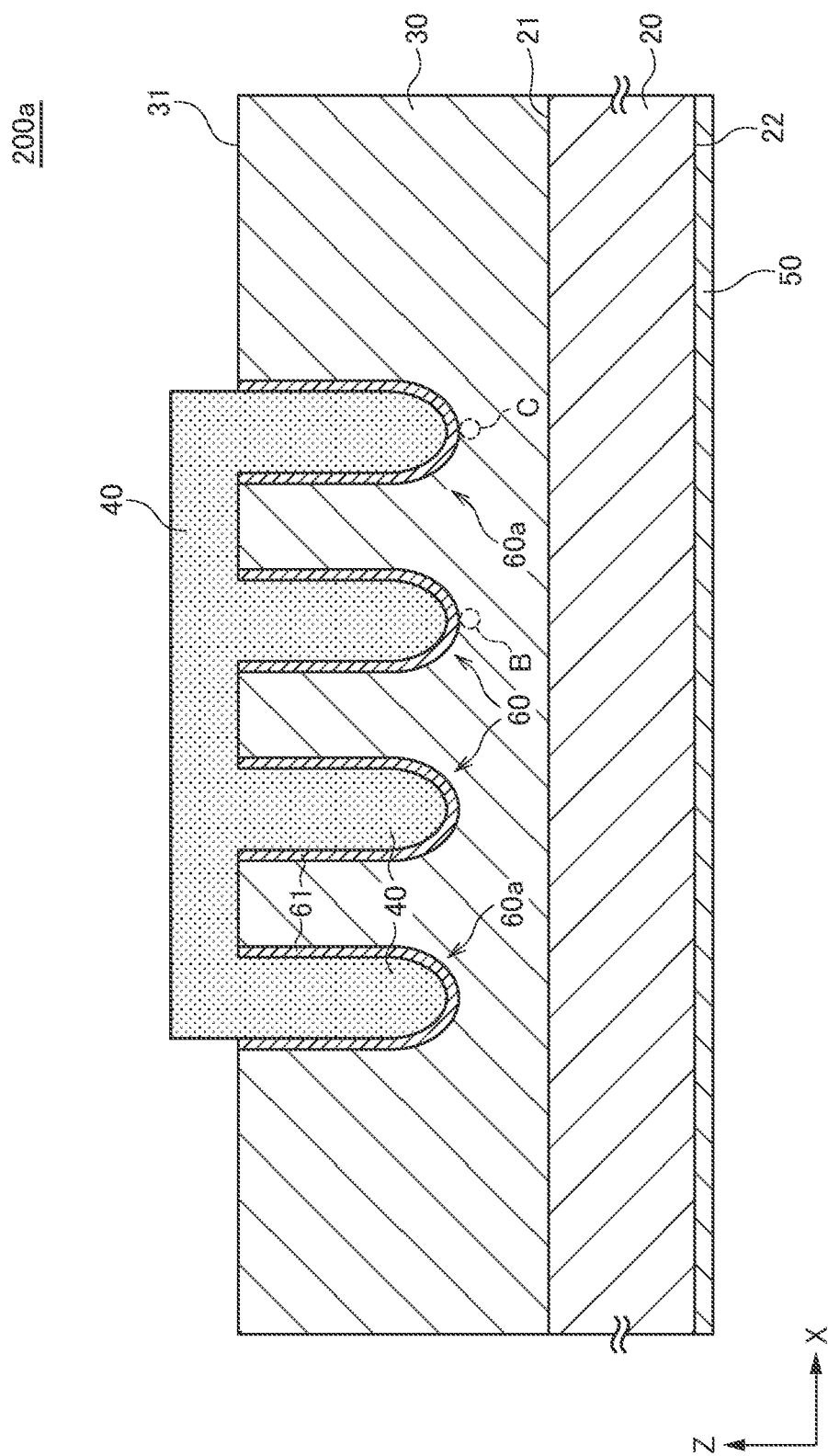
FIG. 9 is a schematic cross-sectional view illustrating the configuration of a Schottky barrier diode 200a according to a Comparative Example 1.
Figure 10:
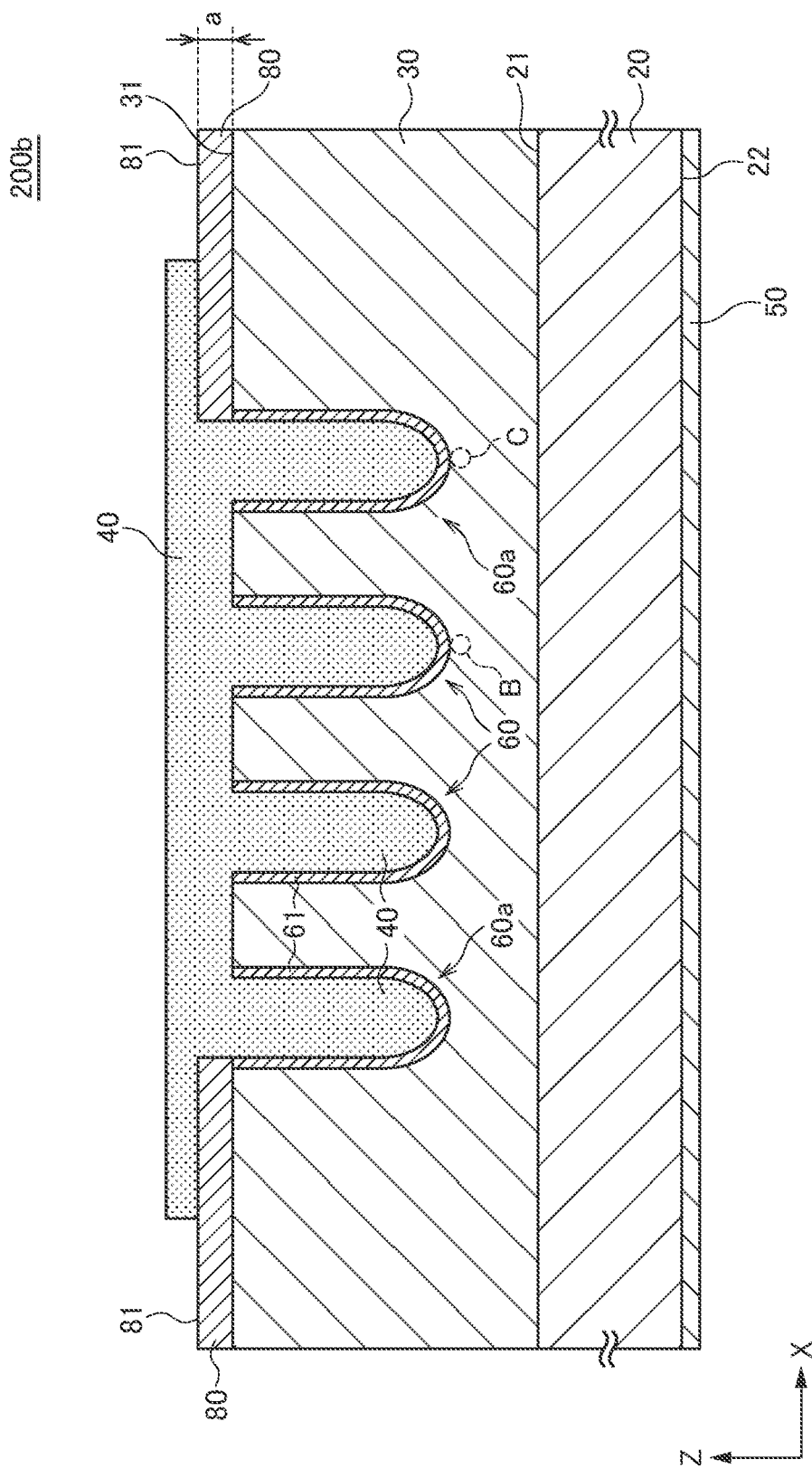
FIG. 10 is a schematic cross-sectional view illustrating the configuration of a Schottky barrier diode 200b according to a Comparative Example 2.

For comparison, a simulation model of Comparative Example 1 having the same structure as a Schottky barrier diode 200a illustrated in FIG. 9 and a simulation model of Comparative Example 2 having the same structure as a Schottky barrier diode 200b illustrated in FIG. 10 were assumed, and electric field strength was simulated with a backward voltage applied between the anode electrode 40 and the cathode electrode 50. The Schottky barrier diode 200a illustrated in FIG. 9 differs from the Schottky barrier diode 200 illustrated in FIG. 8 in that the semiconductor layer 70 and the insulating layer 80 are removed. The Schottky barrier diode 200b illustrated in FIG. 10 differs from the Schottky barrier diode 200 illustrated in FIG. 8 in that the semiconductor layer 70 is removed and that it has a field plate structure in which the outer peripheral portion of the anode electrode 40 rides over the upper surface 81 of the insulating layer 80.

Figure 11:
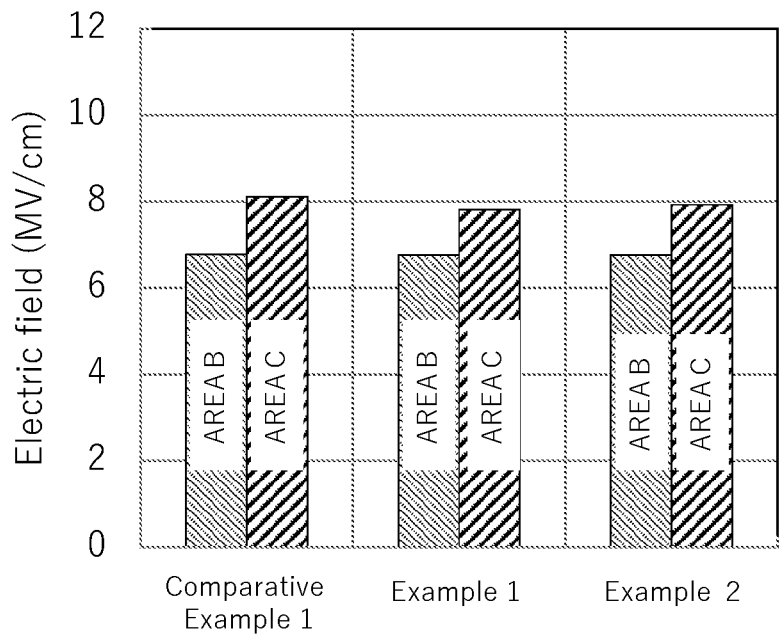
FIG. 11 is a graph indicating a simulation result of an Example 1.
Figure 12:
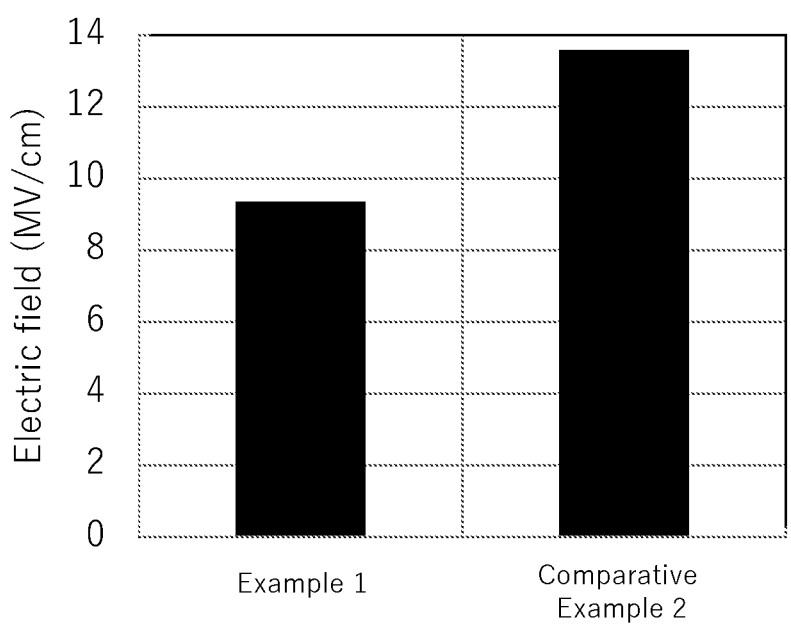
FIG. 12 is a graph indicating a simulation result of an Example 1.

FIG. 11 illustrates the strength of the electric field applied to areas B and C illustrated in FIGS. 8 to 10. The area B is an area immediately below the center trench 60 positioned at a location other than the end portion, and the area C is an area immediately below the center trench 60a positioned at the end portion. FIG. 12 illustrates the maximum values of the electric field applied to the insulating layer 80.

As illustrated in FIG. 11, the strength of the electric field applied to the area B was 6.8 MV/cm in all the simulation models, while the strength of the electric field applied to the area C is 7.8 MV/cm in the simulation model of Example 1, and 8.1 MV/cm and 7.9 MV/cm in the respective simulation models of Comparative Examples 1 and 2. Thus, the electric field strength exceeds about 8 MV/cm, which is the withstand voltage of gallium oxide, in the simulation model of Comparative Example 1, while it does not exceed about 8 MV/cm in the simulation models of Example 1 and Comparative Example 2.

However, as illustrated in FIG. 12, in the simulation model of Comparative Example 2, the maximum value of the electric field applied to the insulating layer 80 is 13.6 MV/cm, which significantly exceeds the dielectric withstand voltage of SiO$_2$ (about 10 mV/cm). On the other hand, in the simulation model of Example 1, the maximum value of the electric field applied to the insulating layer 80 is 9.4 MV/cm that is less than the dielectric withstand voltage of SiO$_2$.

Example 2

A simulation model of Example 2 having the same configuration as the simulation model of Example 1 was assumed, and electric field strength was simulated with a backward voltage applied between the anode electrode 40 and the cathode electrode 50 while the thickness a of the insulating layer 80 was variously changed. The width b of a part of the semiconductor layer 70 that contacts the drift layer 30 and the width c of the semiconductor layer 70 that is positioned on the insulating layer 80 were set to 10 μm and 10 μm, respectively.

Figure 13:
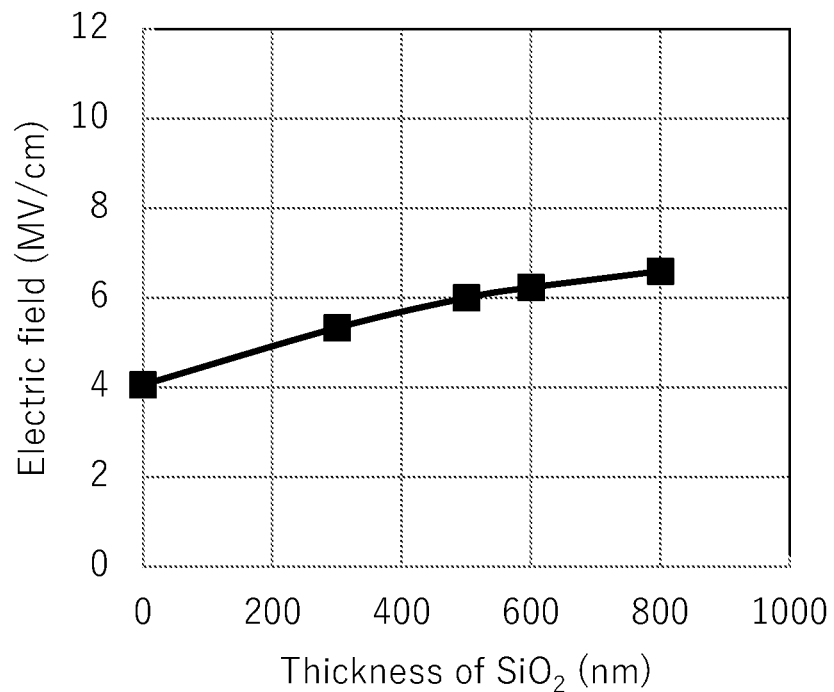
FIG. 13 is a graph indicating a simulation result of an Example 2.
Figure 14:
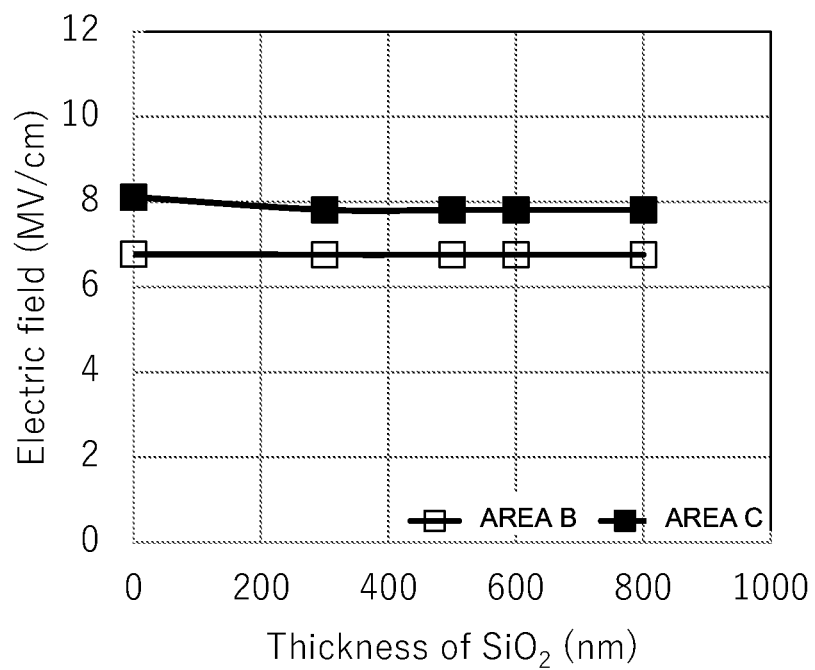
FIG. 14 is a graph indicating a simulation result of an Example 2.
Figure 15:
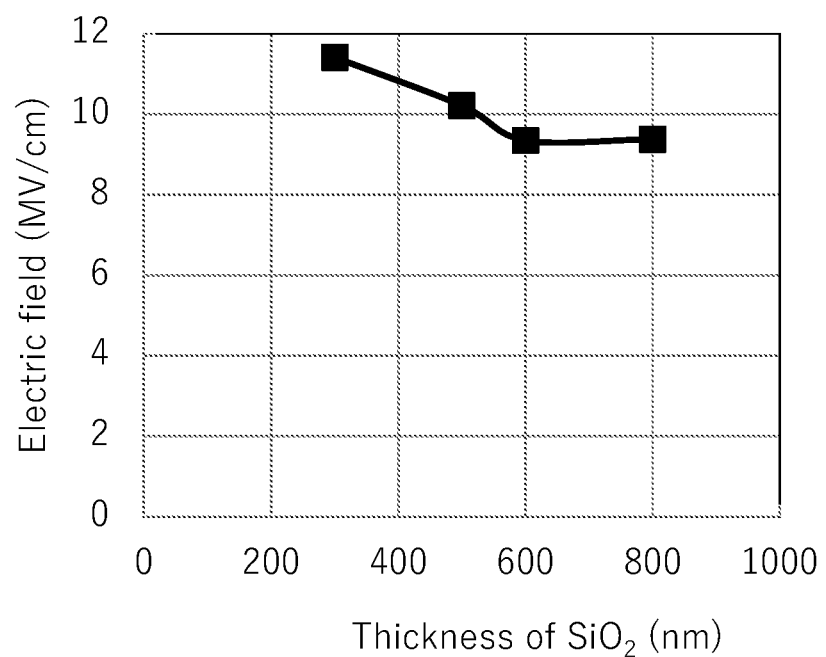
FIG. 15 is a graph indicating a simulation result of an Example 2.

FIGS. 13 to 15 are graphs illustrating the simulation results of Example 2. The values in the graph of FIG. 13 denote the strength of the electric field applied to a part of the drift layer 30 that covers the inner peripheral edge of the insulating layer 80, i.e., the area A in FIG. 8. The values in the graph of FIG. 14 denote the strength of the electric field applied to the areas B and C in FIG. 8. The area B is an area immediately below the center trench 60 positioned at a location other than the end portion, and the area C is an area immediately below the center trench 60a positioned at the end portion. The values in the graph of FIG. 15 denote the maximum values of the electric field applied to the insulating layer 80.

As illustrated in FIG. 13, the strength of the electric field applied to the area A becomes higher as the thickness a of the insulating layer 80 is larger; however, it does not exceed about 8 MV/cm which is the withstand voltage of gallium oxide at least in a range where the thickness a of the insulating layer 80 is equal to or smaller than 800 nm. On the other hand, as illustrated in FIG. 14, when the thickness a of the insulating layer 80 is equal to or larger than 300 nm, the strength of the electric field applied to the area C hardly changes even with a change in the thickness a of the insulating layer 80 and is 7.8 MV/cm, while when the thickness a of the insulating layer 80 is 0 nm, that is, when the insulating layer 80 is absent, the strength of the electric field applied to the area C is 8.1 MV/cm. Further, as illustrated in FIG. 15, when the thickness a of the insulating layer 80 is equal to or larger than 600 nm, the strength of the electric field applied to the insulating layer 80 hardly changes even with a change in the thickness a of the insulating layer 80 and is 9.4 MV/cm, while when the thickness a of the insulating layer 80 is 500 nm, the strength of the electric field applied to the insulating layer 80 is 10.2 MV/cm, and when the thickness a of the insulating layer 80 is 300 nm, the strength of the electric field applied to the insulating layer 80 is 11.4 MV/cm. Thus, considering that the withstand voltage of $SiO_2$ is about 10 MV/cm, the thickness a of the insulating layer 80 should preferably be 600 nm or larger.

Example 3

A simulation model of Example 3 having the same configuration as the simulation model of Example 1 was assumed, and electric field strength was simulated with a backward voltage applied between the anode electrode 40 and the cathode electrode 50 while the width b of a part of the semiconductor layer 70 that contacts the drift layer 30 was variously changed. The thickness a of the insulating layer 80 and the width c of the semiconductor layer 70 that is positioned on the insulating layer 80 were set to 600 nm and 10 µm, respectively.

Figure 16:
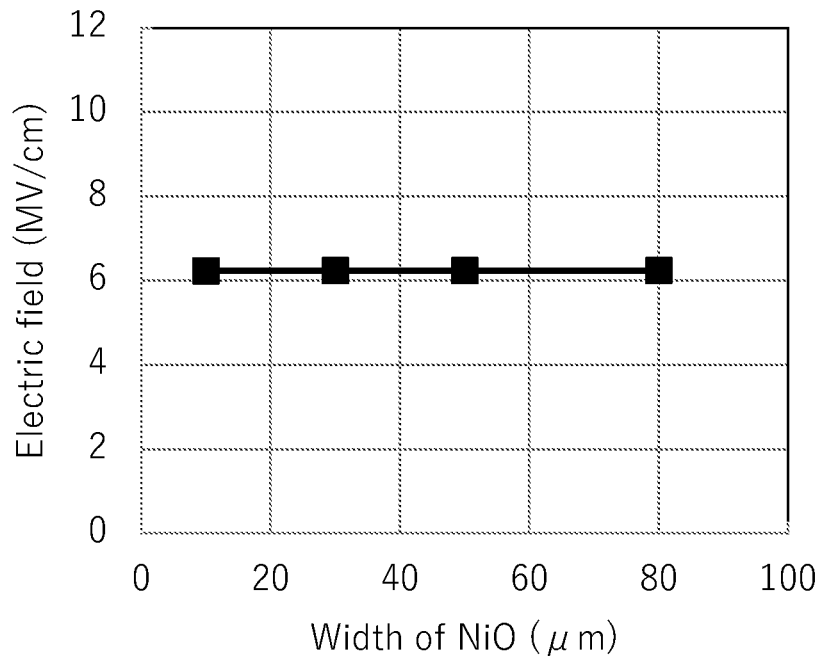
FIG. 16 is a graph indicating a simulation result of an Example 3.

FIG. 16 is a graph illustrating the simulation result of Example 3. The values in the graph of FIG. 16 denote the strength of the electric field applied to the area A in FIG. 8. As illustrated in the graph of FIG. 16, the strength of the electric field applied to the area A hardly changes even with a change in the width b of a part of the semiconductor layer 70 that contacts the drift layer 30 and is 6.2 MV/cm.

Example 4

A simulation model of Example 4 having the same configuration as the simulation model of Example 1 was assumed, and electric field strength was simulated with a backward voltage applied between the anode electrode 40 and the cathode electrode 50 while the width c of a part of the semiconductor layer 70 that is positioned on the insulating layer 80 was variously changed. The thickness a of the insulating layer 80 and the width b of a part of the semiconductor layer 70 that contacts the drift layer 30 were set to 600 nm and 10 µm, respectively.

Figure 17:
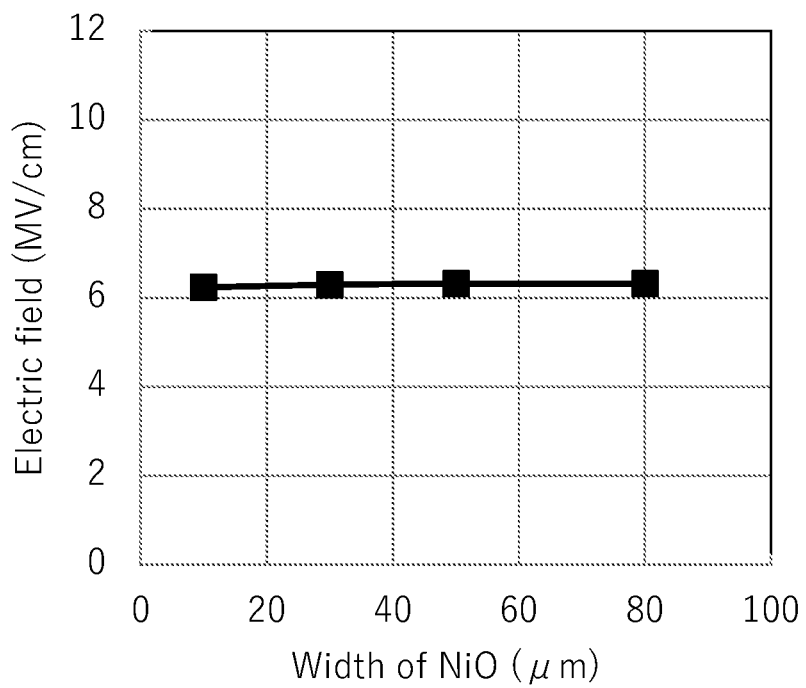
FIG. 17 is a graph indicating a simulation result of an Example 4.

FIG. 17 is a graph illustrating the simulation result of Example 4. The values in the graph of FIG. 17 also denote the strength of the electric field applied to the area A in FIG. 8. As illustrated in the graph of FIG. 17, the strength of the electric field applied to the area A hardly changes even with a change in the width c of a part of the semiconductor layer 70 that is positioned on the insulating layer 80 and is 6.3 MV/cm.

Example 5

A simulation model of Example 5 having the same configuration as the simulation model of Example 1 was assumed, and electric field strength was simulated with a backward voltage applied between the anode electrode 40 and the cathode electrode 50 while the gap G1 illustrated in FIG. 5 was variously changed. The thickness a of the insulating layer 80, the width b of a part of the semiconductor layer 70 that contacts the drift layer 30, and the width c of a part of the semiconductor layer 70 that is positioned on the insulating layer 80 were set to 600 nm, 30 µm, and 30 µm, respectively.

Figure 18:
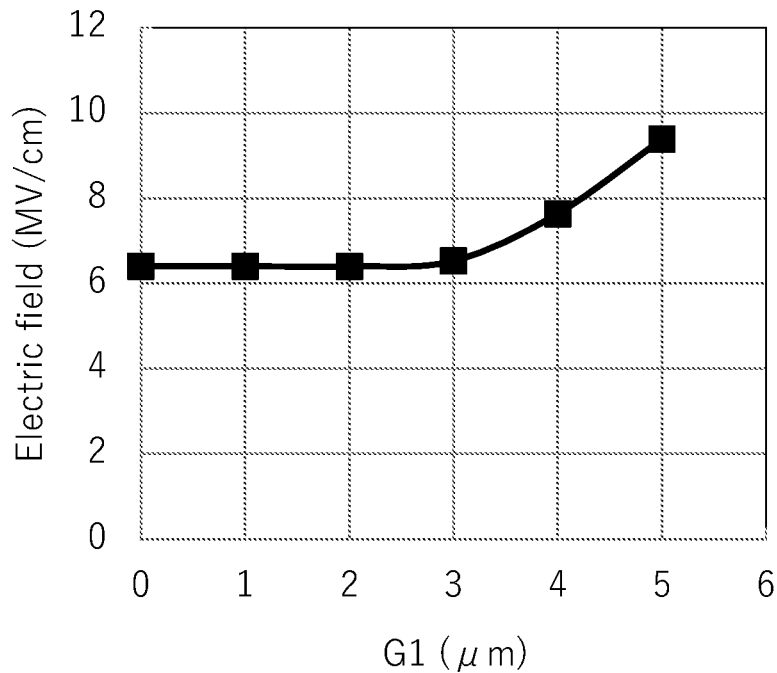
FIG. 18 is a graph indicating a simulation result of an Example 5.
Figure 19:
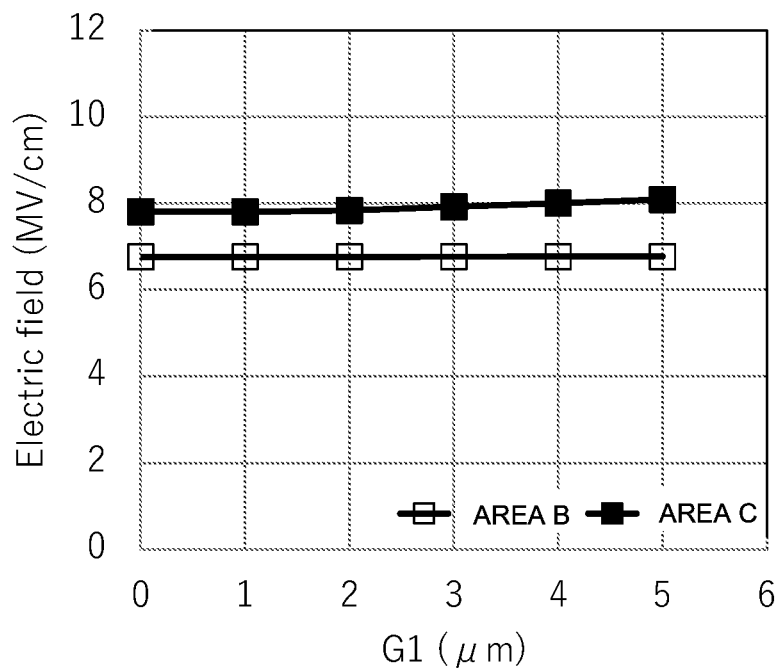
FIG. 19 is a graph indicating a simulation result of an Example 5.

FIGS. 18 and 19 are each a graph illustrating the simulation result of Example 5. The values in the graph of FIG. 18 denote the strength of the electric field applied to an area D in FIG. 5, and the values in the graph of FIG. 19 denote the strength of the electric field applied to the areas B and C in FIG. 8. The area D is an area immediately below the gap G1. As illustrated in FIG. 18, the electric field applied to the area D becomes stronger as the gap G1 is larger. Specifically, when the gap G1 is 4 µm, the electric field strength is 7.6 MV/cm, and when the gap G1 is 5 µm, the electric field strength is 9.4 MV/cm. Similarly, as illustrated in FIG. 19, the electric field applied to the area C becomes stronger as the gap G1 is larger. Specifically, when the gap G1 is 4 µm, the electric field strength is 8.0 MV/cm, and when the gap G1 is 5 µm, the electric field strength is 8.1 MV/cm. Thus, considering that the withstand voltage of gallium oxide is about 8 MV/cm, the gap G1 is preferably 4 µm or smaller.

Example 6

A simulation model of Example 6 having the same configuration as that of the simulation model of Example 1 was assumed, and electric field strength was simulated with a backward voltage applied between the anode electrode 40 and the cathode electrode 50 while the gap G2 illustrated in FIG. 6 was variously changed. The thickness a of the insulating layer 80, the width b of a part of the semiconductor layer 70 that contacts the drift layer 30, and the width c of a part of the semiconductor layer 70 that is positioned on the insulating layer 80 were set to 600 nm, 30 µm, and 30 µm, respectively.

Figure 20:
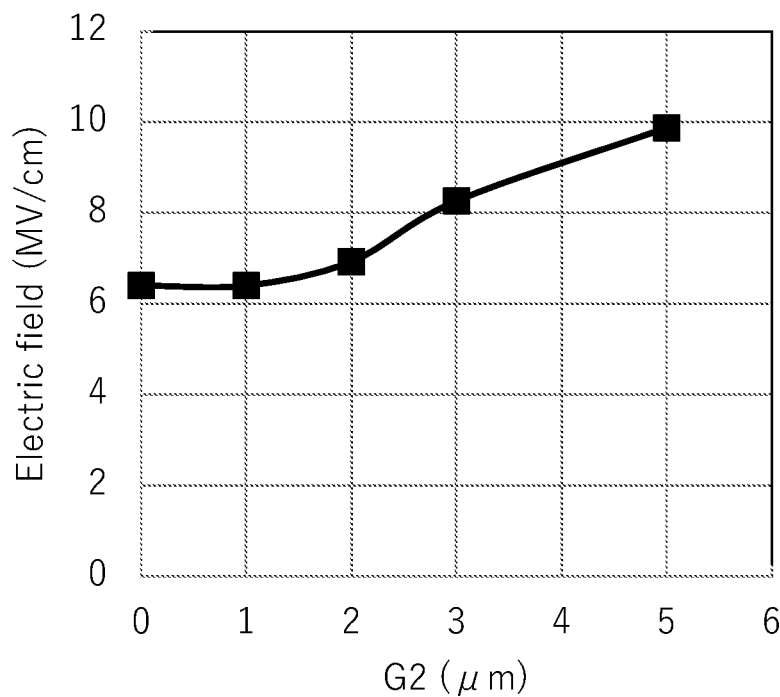
FIG. 20 is a graph indicating a simulation result of an Example 6.

FIG. 20 is a graph illustrating the simulation result of Example 6. The values in the graph of FIG. 20 denote the strength of the electric field applied to an area E in FIG. 6. The area E is an area immediately below the gap G2. As illustrated in FIG. 20, the electric field applied to the area E becomes stronger as the gap G2 is larger. Specifically, when the gap G2 is 2 µm, the electric field strength is 6.9 MV/cm, and when the gap G2 is 3 µm, the electric field strength is 8.3 MV/cm. Thus, considering that the withstand voltage of gallium oxide is about 8 MV/cm, the gap G2 should preferably be 2 µm or smaller.

Example 7

Figure 7:
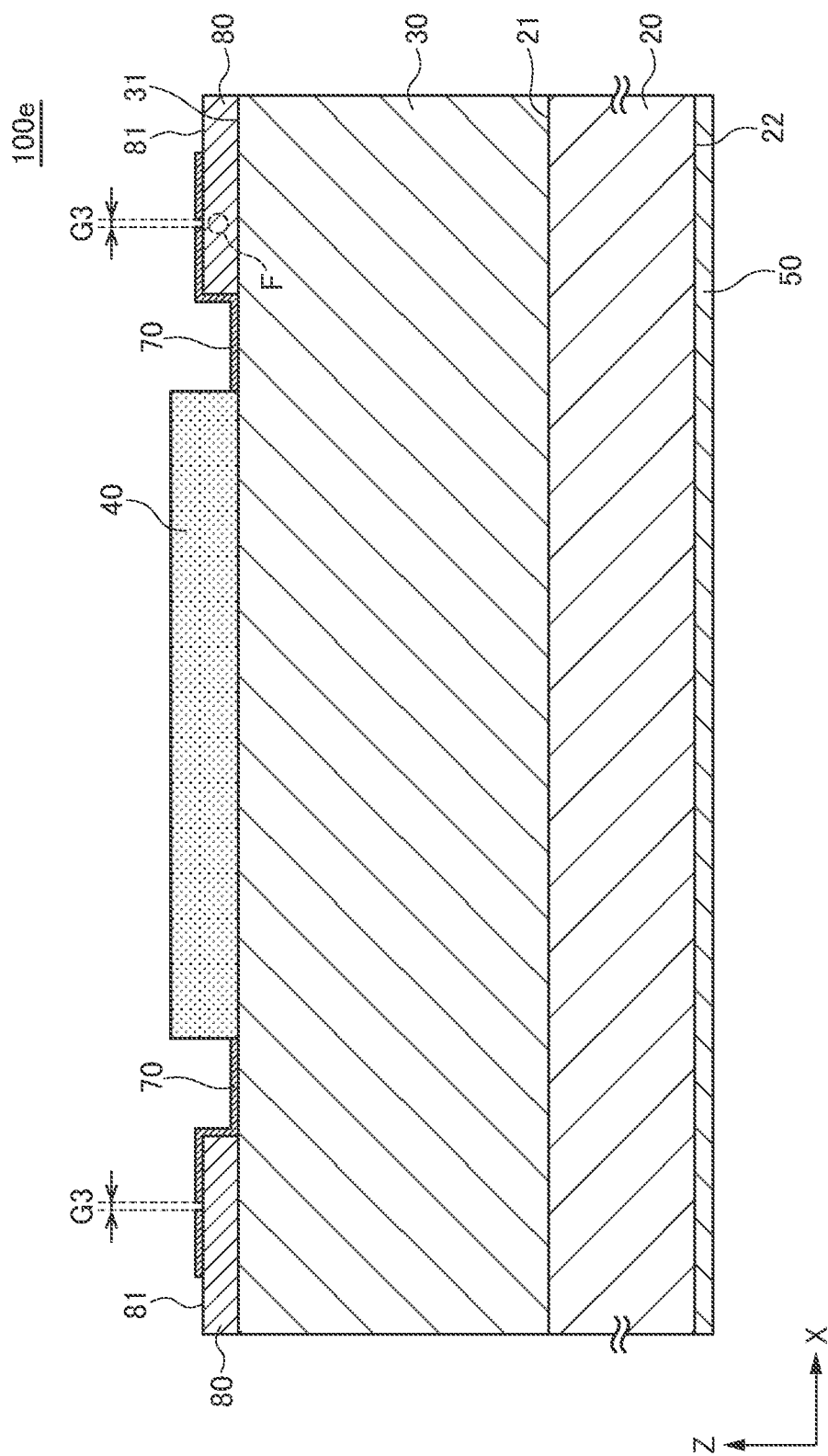
FIG. 7 is a schematic cross-sectional view illustrating the configuration of a Schottky barrier diode 100e according to a fifth modification of the first embodiment.

A simulation model of Example 7 having the same configuration as the simulation model of Example 1 was assumed, and electric field strength was simulated with a backward voltage applied between the anode electrode 40 and the cathode electrode 50 while the gap G3 illustrated in FIG. 7 was variously changed. The thickness a of the insulating layer 80, the width b of a part of the semiconductor layer 70 that contacts the drift layer 30, and the width c of a part of the semiconductor layer 70 that is positioned on the insulating layer 80 were set to 600 nm, 30 μm, and 30 μm, respectively.

Figure 21:
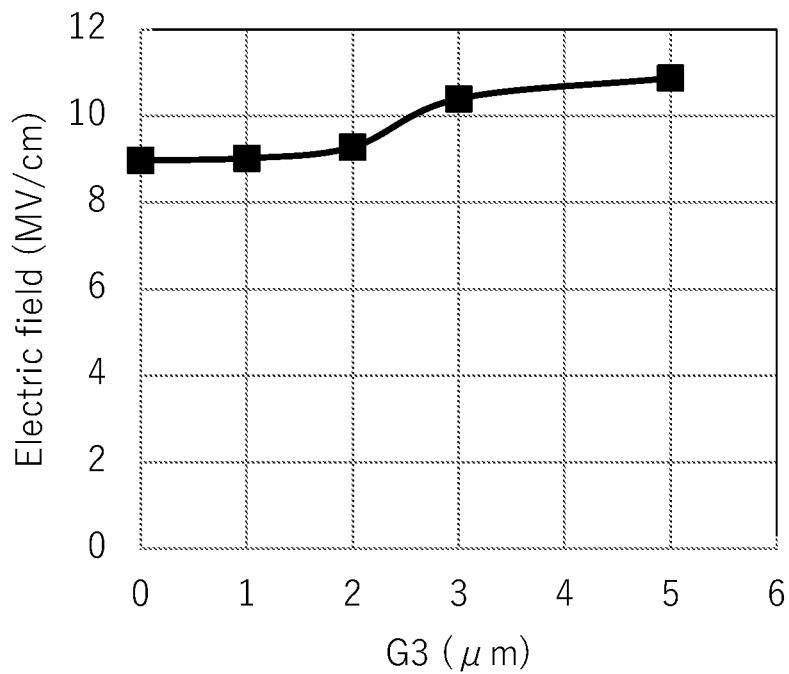
FIG. 21 is a graph indicating a simulation result of an Example 7.

FIG. 21 is a graph illustrating the simulation result of Example 7. The values in the graph of FIG. 21 denote the strength of the electric field applied to an area F in FIG. 7. The area F is an area immediately below the gap G3. As illustrated in FIG. 21, the electric field applied to the area F becomes stronger as the gap G3 is larger. Specifically, when the gap G3 is 2 μm, the electric field strength is 9.3 MV/cm, and when the gap G3 is 3 μm, the electric field strength is 10.4 MV/cm. Thus, considering that the withstand voltage of $SiO_2$ is about 10 MV/cm, the gap G3 should preferably be 2 μm or smaller.

Example 8

A simulation model of Example 8 having the same configuration as the simulation model of Example 1 was assumed, and electric field strength was simulated with a backward voltage applied between the anode electrode 40 and the cathode electrode 50 while a relative dielectric constant E of the insulating layer 80 was variously changed. The thickness a of the insulating layer 80, the width b of a part of the semiconductor layer 70 that contacts the drift layer 30, and the width c of a part of the semiconductor layer 70 that is positioned on the insulating layer 80 were set to 600 nm, 30 μm, and 30 μm, respectively.

Figure 22:
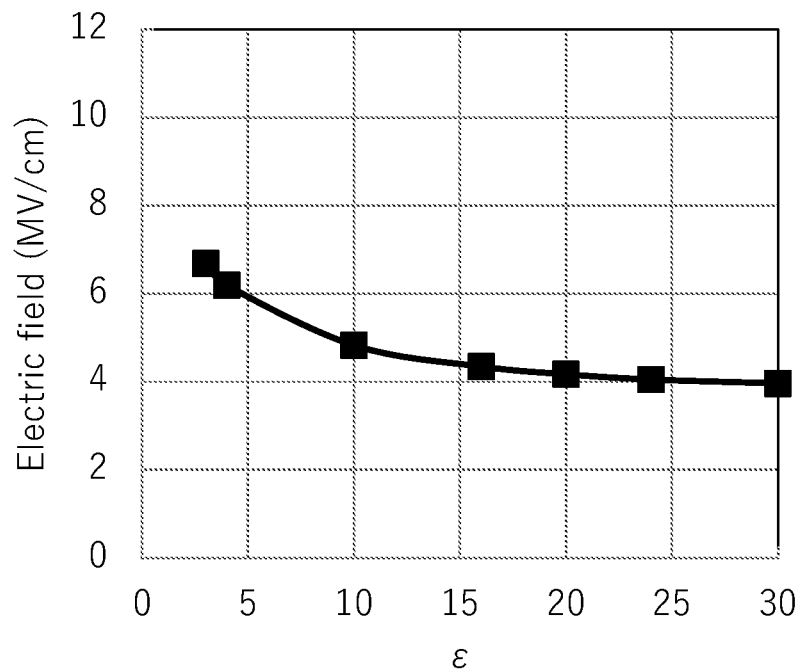
FIG. 22 is a graph indicating a simulation result of an Example 8.
Figure 23:
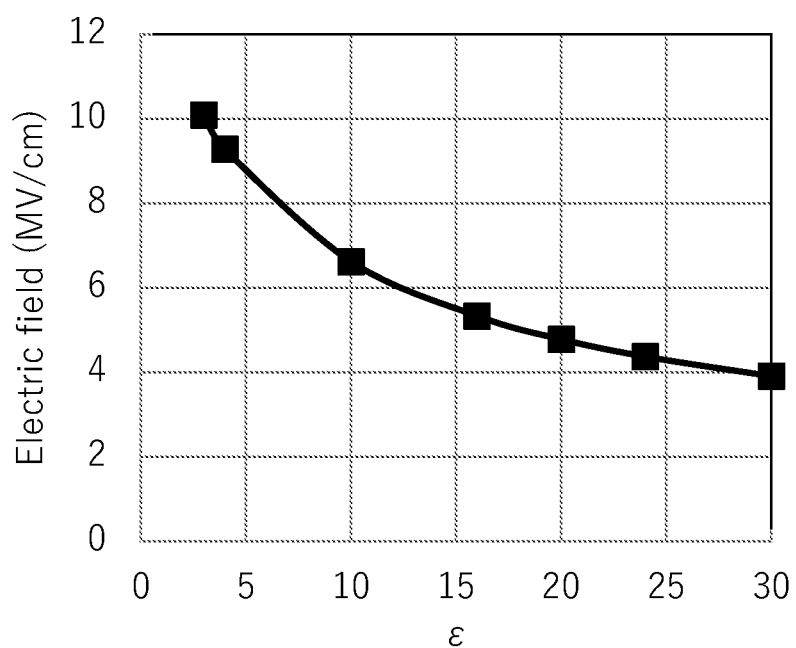
FIG. 23 is a graph indicating a simulation result of an Example 8.

FIGS. 22 and 23 are each a graph illustrating the simulation result of Example 8. The values in the graph of FIG. 22 denote the maximum values of the electric field strength at a part of the drift layer 30 that is covered with the semiconductor layer 70. The values in the graph of FIG. 23 denote the maximum values of the strength of the electric field applied to the insulating layer 80. As illustrated in FIGS. 22 and 23, the electric field applied to the drift layer 30 and the insulating layer 80 becomes more relaxed as the relative dielectric constant £ is higher. Further, when the relative dielectric constant £ is in a range of 3 to 30, the electric field applied to the drift layer 30 is equal to or lower than 8 MV/cm, which is the withstand voltage of gallium oxide.

On the other hand, the dielectric withstand voltage of the insulating layer 80 differs depending on a material to be selected, and thus, only required here is to select a material having a dielectric withstand voltage higher than the curve in the graph of FIG. 23. For example, $SiO_2$ has a dielectric constant of 3.9 and a dielectric withstand voltage of equal to or higher than 10 MV/cm and is thus suitable as the material of the insulating layer 80.

REFERENCE SIGNS LIST

20 semiconductor substrate
21 upper surface of semiconductor substrate
22 back surface of semiconductor substrate
30 drift layer
31 upper surface of drift layer
40 anode electrode
50 cathode electrode
60 center trench
60a center trench positioned at end portion
61 insulating film
61 semiconductor layer
70 insulating layer
80a upper surface of insulating layer
100, 100a-100e, 200, 200a, 200b Schottky barrier diode
A-F area
G1-G3 gap

What is claimed is:

1. A Schottky barrier diode comprising:
    a semiconductor substrate made of gallium oxide;
    a drift layer made of gallium oxide and provided on the semiconductor substrate;
    an anode electrode brought into Schottky contact with the drift layer;
    a cathode electrode brought into ohmic contact with the semiconductor substrate;
    an insulating layer provided on the drift layer so as to surround the anode electrode in a plan view and so as not to overlap the anode electrode in a cross-sectional view; and
    a semiconductor layer provided on a surface of a part of the drift layer that is positioned between the anode electrode and the insulating layer and on the insulating layer, the semiconductor layer having a conductivity type opposite to that of the drift layer.

2. The Schottky barrier diode as claimed in claim 1, wherein the semiconductor layer is made of an oxide semiconductor material.

3. The Schottky barrier diode as claimed in claim 1, wherein the anode electrode and the semiconductor layer overlap each other.

4. The Schottky barrier diode as claimed in claim 1, wherein the drift layer further has a plurality of center trenches formed at a position overlapping the anode electrode in a plan view.

5. The Schottky barrier diode as claimed in claim 4, wherein an inner wall of each of the plurality of center trenches is covered with an insulating film.

6. The Schottky barrier diode as claimed in claim 2, wherein the anode electrode and the semiconductor layer overlap each other.

7. The Schottky barrier diode as claimed in claim 2, wherein the drift layer further has a plurality of center trenches formed at a position overlapping the anode electrode in a plan view.

8. The Schottky barrier diode as claimed in claim 7, wherein an inner wall of each of the plurality of center trenches is covered with an insulating film.

9. The Schottky barrier diode as claimed in claim 1, wherein the anode electrode does not contact with the insulating layer.

10. The Schottky barrier diode as claimed in claim 1, wherein the anode electrode does not overlap the semiconductor layer.

11. The Schottky barrier diode as claimed in claim 1, wherein the insulating layer has a lower surface contacting the drift layer and an upper surface opposite to the lower surface, and
    wherein the semiconductor layer is provided on the upper surface of the insulating layer.

12. The Schottky barrier diode as claimed in claim 11,
wherein the insulating layer further has an inner side surface facing the anode electrode, and
wherein the semiconductor layer is further provided on the inner side surface of the insulating layer.

13. The Schottky barrier diode as claimed in claim 12, wherein the inner side surface of the insulating layer is perpendicular to the lower and upper surfaces of the insulating layer.

14. The Schottky barrier diode as claimed in claim 1, wherein the drift layer, the insulating layer, and the semiconductor layer are stacked in this order.

15. The Schottky barrier diode as claimed in claim 1,
wherein the drift layer has a first surface contacting the semiconductor substrate and a second surface opposite to the first surface,
wherein the second surface of the drift layer includes a first area covered by the anode electrode without covered by the insulating layer, a second area covered by the insulating layer without covered by the anode electrode, and a third area located between the first and second areas, and
wherein the third area is covered by the semiconductor layer without covered by the anode electrode and the insulating layer.

16. The Schottky barrier diode as claimed in claim 15, wherein a part of the second area is covered by the insulating layer and the semiconductor layer.

* * * * *